US00RE37325B1

(19) United States
(12) Reissued Patent
Keren et al.

(10) Patent Number: US RE37,325 E
(45) Date of Reissued Patent: Aug. 14, 2001

(54) SLICE ORIENTATION SELECTION ARRANGEMENT

(76) Inventors: Hanan Keren, 43/12 HaGalil, Kfar Saba 44106; David Freundlich, 4 Bnei-Brit Street, Haifa 34752, both of (IL)

(21) Appl. No.: 09/234,439

(22) Filed: Jan. 21, 1999

Related U.S. Patent Documents

Reissue of:
(64) Patent No.: 4,710,716
Issued: Dec. 1, 1987
Appl. No.: 06/778,503
Filed: Sep. 20, 1985

(30) Foreign Application Priority Data

Sep. 24, 1984 (IL) ..... 73038

(51) Int. Cl.[7] ..... G01V 3/00
(52) U.S. Cl. ..... 324/309; 324/307
(58) Field of Search ..... 324/309, 307, 324/300, 318

(56) References Cited

U.S. PATENT DOCUMENTS 4,318,043 * 3/1982 Crooks ..... 324/309
4,339,716 * 7/1982 Young ..... 324/309
4,374,360 * 2/1983 Stepponen ..... 324/309
4,385,397 * 5/1983 Verro ..... 324/309
4,390,840 * 6/1983 Ganssen ..... 342/309
4,626,784 * 12/1986 Sepponen ..... 324/309

* cited by examiner

*Primary Examiner*—Christine Oda
*Assistant Examiner*—Brij B. Shrivastav
(74) *Attorney, Agent, or Firm*—Greenblum & Bernstein P.L.C.

(57) ABSTRACT

A slice orientation selection arrangement for magnetic resonance imaging in planes oblique to the normal cartesian coordinates. The coordinates are rotated to applying gradient signals using Euler computations.

12 Claims, 7 Drawing Sheets

BINARY COUNT
DECADE COUNTER
ONE SHOT
LATCH 1
LATCH 2
LATCH 3
LATCH 4
LATCH 5
LATCH 6
STROBE X
STROBE Y
STROBE Z
Ø SEL
ADD SEL
COS SEL
X SEL
Y SEL
Z SEL
X SEL
CK
111
112
113a
113b
114a
114b
117
118
119
121
122
123
124
126
127
128
129
131
132
133
134
135
136
137
138
139
141
142
143
144
146
147
148
149
153
154
156
157
158
159
161
162
163
166
51
63

SLICE ORIENTATION SELECTION ARRANGEMENT

Matter enclosed in heavy brackets [ ] appears in the original patent but forms no part of this reissue specification; matter printed in italics indicates the additions made by reissue.

FIELD OF THE INVENTION

This invention relates to Magnetic Resonance Imaging ("MRI") systems and more particularly to slice selection arrangements for use with such MRI systems.

BACKGROUND OF THE INVENTION

One of the advantages of MRI systems is a lack of moving parts. In contrast to CT imaging systems, there are no detectors or radiation sources which translate and/or rotate about the object or patient. Instead of the rotating parts, slices to be images are selected by manipulating field gradients and pulse sequences to provide images in the usual sagittal, coronal or transverse (axial) planes. Thus it is known to vary the static magnetic field with gradient pulses applied during the application of RF (Larmor) frequency pulses to select the imaging planes.

For example, consider an MRI system laid out according to the X, Y, and Z cartesian coordinates with the static field applied extending in the direction of the Z axis. The patient is oriented longtitudinally coaxially with the Z axis. Generally speaking, sagittal, coronal or transverse imaging planes are selected by applying the RF pulse simultaneously with the Y gradient pulse, an X gradient pulse or a Z gradient pulse, respectively.

In contrast to this, in other modalities using equipment such as CT scanners, the detector and/or the X-ray source are rotated. Usually rotation and thus data acquisition is accomplished for mechanical reasons in a transverse plane, about the patient's body. It is true that the source of X-ray energy and/or the detectors can be made to swivel so as to image planes at angles to the transverse planes. Nevertheless, the imaging capability is certainly mechanically limited. With MRI systems there is no such mechanical limitations; and therefore, theoretically, it is possible to acquire image data from any direction or in any plane. However, instead of mechanical limitations, there are practical, mathematical and processing limitations to obtaining images in non-orthoganal planes. Accordingly, such images in the non-orthoganal planes have not been used. Those skilled in the art know that when more than one gradient is simulateously applied during the excitation procedure, the imaging process will be unduly complicated. The actual gradients and the read or data collect gradient will also have to comprise multiple gradients. The selection of each of the gradients is further complicated by its relationship to the other gradients.

Certain set procedures are used in the prior art to obtain the exact type of image wanted in MRI systems. For example, the procedure followed in obtaining spin echo images in an orthogonal plane is to apply a plane selection gradient during the application of a shaped, selected RF saturation pulse signal. The position plane selection gradient is followed by a defocusing negative of the plane selecting gradient. After a time period "Ta" following the saturation RF pulse, an inversion RF pulse is applied. Again, a plane selecting gradient is applied during the echo inducing signal application period. Prior to the application of the read gradient, an encoding gradient signal is applied. The field generated by the encoding gradient signal is mutually orthogonal to each of the fields generated by the plane selecting gradient and the read gradient. After another time period Ta another inversion pulse is applied during the application of the plane selecting gradient pulse. A second echo pulse is generated at a time period Ta following the application of the second inversion pulse. The process is repeated as long as meaningful "echos" are obtained.

To select a non-orthogonal plane (herein a plane neither parallel nor normal to more than one of the orthogonal XY, XZ and YZ planes) in the object, at least two orthogonal gradient pulses have to be a simultaneously applied. Consequently, the encoding and reading gradients each also require at least two simultaneously applied gradient fields of proper amplitude and width to select the encoding and reading gradients. The complications involved in such a method have deterred imaging in any but non-orthogonal planes until now. Accordingly, there is a need for the efficient imaging of non-orthogonal planes with NMR equipment.

It is known in the X-ray medical imaging art to use means for visibly indicating the location on the patient of the imaging slices. Thus, for example, in CT imaging, it is known to apply external light lines to the patient for aiding in aligning the imaging equipment. See for example U.S. Pat. No. 4,385,397. Such indicating means have not been applied in the magnetic resonance imaging art.

BRIEF DESCRIPTION OF THE INVENTION

The slice orientation selection arrangement taught herein is ideally suited for usage in cooperation with visible orientation indications aligned with the patient's organs. The aligning of the visible orientation indication automatically selects the plane or slice that will encompass a portion of the patient or an organ of the patient.

Accordingly it is an object of the present invention to provide means and methods for imaging in non-orthogonal planes with MRI equipment and for automatically selecting such planes with reliability and facility.

According to the present invention a method of imaging an object is provided wherein the slice selection is at any desired angle to the usual XYZ coordinates of an MRI system, the method comprises the steps of:

subjecting the object to a static strong magnetic field along the Z coordinate in order to generate magnetic moments extending in the Z direction, applying an RF magnetic signal rotating at the Larmor frequency to preturb said magnetic moments and to generate FID signals, varying said static field during the application of the RF field using a first and second magnetic gradient for selection an imaging plane not necessarily orthogonal to either said X, said Y or said Z planes, and rotating the coordinate system prior to applying the gradient signals so that location of the magnetic used to select the non-orthogonal imaging plane is automatically accomplished.

A feature of the invention utilizes as the angle of rotation of the XYZ coordinates an angle obtained using visible indicators or the subject to determine the desired plane of imaging.

BRIEF DESCRIPTION OF THE DRAWINGS

The above mentioned and other features of this invention will be better understood with reference to the following description made in conjunction with the accompanied drawings, wherein.

GENERAL DESCRIPTION

Figure 1:
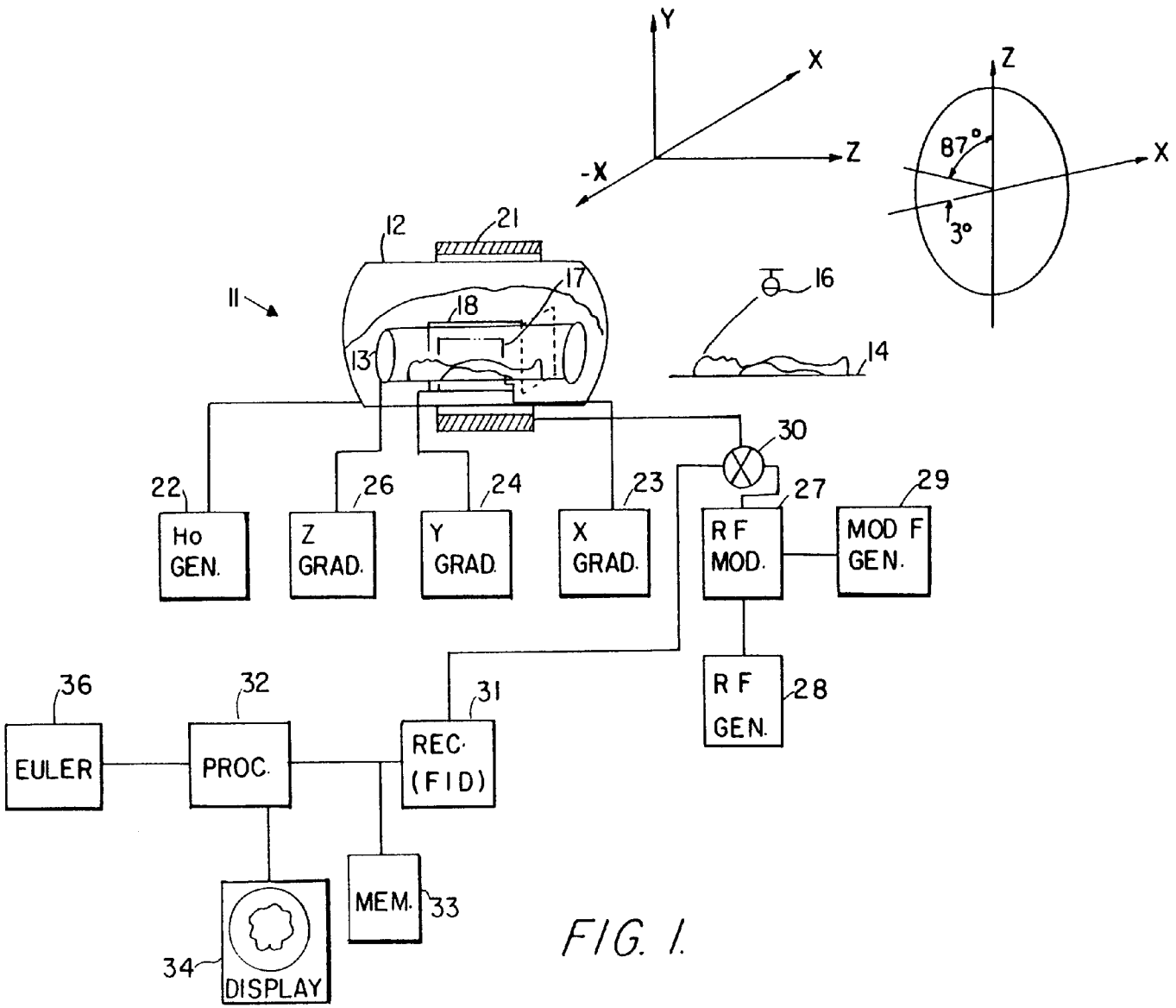
FIG. 1 is a block diagram of an MRI system using the invention.

FIG. 1, at 11 shows a typical MRI system. Means, such as magnet 12, are provided for generating a large static magnetic field. The magnet includes a tunnel 13, in which a patient is placed during the examination by the MRI system. Initially, the patient is placed on a mobile bed, 14, which is movable into the tunnel. While the patient is on the bed external to the tunnel, a line generating light system shown generally at 16, can be used to orient and align the system with some straight line characteristic of the patient, such as the alignment of the patients eyes, for example.

The MRI system further includes gradient coils such as X-gradient coils 17, Y-gradient coils 18 and Z-gradient coils 19. The usual transmitting and receiving radio frequency (RF) coils are shown at 21. The system further includes a current generator, shown at 22, for generating the current necessary to activate the static magnet. The static magnet can be resistive type magnet, a superconductive type magnet or a permanent magnet within the scope of the invention, although in a preferred embodiment, a superconductive type magnet was utilized.

The gradient coils are each activated by appropriate gradient generators, such as the X-gradient 23, Y-gradient 24, and Z-gradient generator 26. Each of the gradient generators generate the current pulses necessary to provide the gradient field required in the MRI systems.

Similarly, the RF coils, used for transmitting and receiving, are supplied with the appropriate radio frequency shaped pulses provided by radio frequency modulator 27 during the transmitting mode. The radio frequency modulator is connected to a radio frequency generator 28 and a modulation frequency generator 29, which modulate the carrier and is used for the appropriate shaping of the Rf pulses used in the MRI system. The receiver 31 for receiving the free induction decay (FID) signals is connected to the coils 21 through means such as an electronic switch 30. The electronic switch operates to connect the coils 21 to either transmit the RF signal from the modulator 27 or to sense the FID signals for the receiver equipment 31.

The system is controlled by a processor 32, which directs the system so that the proper gradients are applied at the proper time and so that the entire system functions in accordance with a specified program. Memory means 33 are provided for use with the display 34.

A unique feature of the system 11 is the Euler computation unit 36 coupled to the processor. The function of the Euler computation unit is to simplify imaging in planes that are not normal to the regular orthogonal planes. Before the Euler computation unit can be used, it is necessary to decide on the imaging plane desired.

There are many methods of selecting the imaging plane. For example, the operator can "write" in the angles that the desired plane makes with the regular orthogonal planes. Such angles define the orientation of a selected plane. The precise location is fixed by proper selection of the gradients and the Larmor frequency.

An exemplary system operates to select an imaging plane by imaging an organ of the body at least twice in separate parallel planes. Preferably, the two images each include an organ of interest. A third plane at an angle to the first two planes and that passes through the organ is selected. The two preliminary images are used in the selection of the third plane to obtain angles between the normal orthogonal planes and the selected third plane.

These angles are then used as Euler angles for mathematically shifting the regular X, Y and Z orthogonal axes to new orthogonal axes X', Y' and Z' that are used to define the gradients for the newly selected planes. Performing the Euler shift enables transmitting the signals through the system in a normal manner. The Euler computation unit automatically computes the X', Y' and Z' axes and automatically determines from the computation, according to Euler's method, the proper inputs to the X-, Y- and Z-gradient generators to provide the currents to the X-, Y- and Z-gradient coils to obtain the selected plane.

The system finds use, for example, if a plane through the heart is desired at an angle that will approximately bisect the heart. It is known that the heart does not ordinarily lie in a plane parallel to any of the orthogonal planes in the regular X, Y, and Z coordinates of MRI systems.

Figure 2:
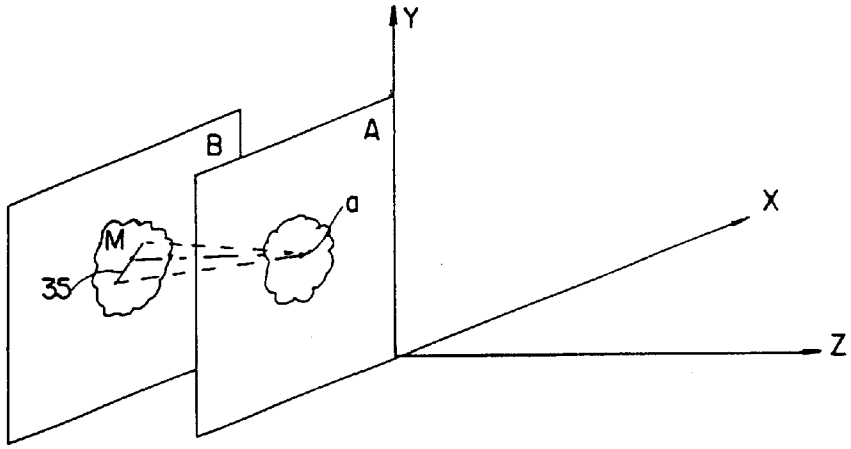
FIG. 2 is a showing of planes along the Z axis parallel to the X-Y plane.

To obtain a non-orthogonal or oblique imaging plane through the patient's heart, two transverse imaging slices of the patient are taken to image the heart along those slices. The slices are shown as plane A and plane B in FIG. 2. The planes are selected in a manner well known in the MRI art. For example, using the regular orthogonal system, a Z-gradient pulse is applied after a static field has been established with the patient in the tunnel. During the application of the Z-gradient pulse, a shaped RF saturation pulse at the Larmor frequency is applied to select the desired XY plane. An encoding signal, for example, A Y-gradient encoding signal is applied preferably, but not necessarily at the same time as X-gradient and Z-gradient focusing pulses are applied. Subsequently, an inversion Rf signal is applied during the application of a new Z-gradient signal. During the time period when an echo FID signal is obtained from the system, an X-gradient is applied. The echo is received and the process is repeated by applying another inversion RF pulse during the application of a Z-gradient signal. The process is repeated with the application of another Y-encoding gradient. This is continued until enough data is obtained to make the image depicted in the A plane of FIG. 2. The process is then continued by selecting the B slice plane through the use of a frequency that will cause the resonance of the hydrogen nuclei in the B plane, due to the applied Z-gradient pulse.

Figure 3:
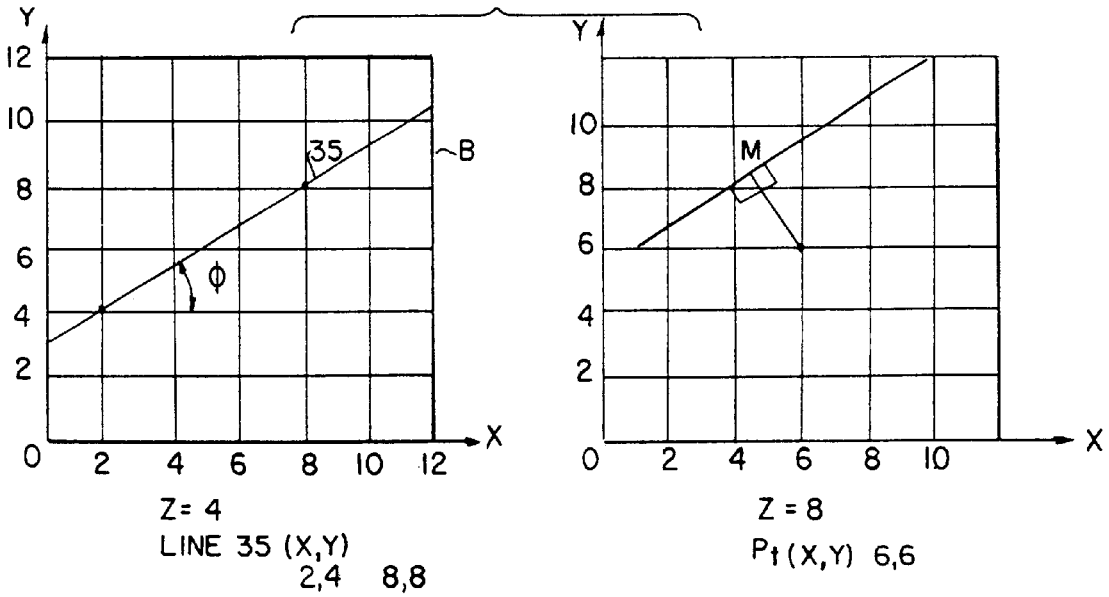
FIG. 3 is a planar view of the planes of FIG. 2.

The operator uses the A and B slices to select the new planes. The operator displays the A and B slices. On the A-plane image, for example, he overlays a dot or point "a" at some strategic location on the heart, i.e. in the center of the image of the heart. Similarly, in the B plane, he overlays a line 35 at some strategic location, such as through the center of a portion of the heart, that is of interest. As shown in FIG. 3 the line 35 and the point (a) on the different planes define the new plane that will subsequently be imaged according to the inventive process. The computer processor 32 determines the Eulerian angle phi (0), which is the angle between the overlay line and a line parallel to the X-axis.

The computer also determines the angle theta (0) which, is the angle between the Z axis and a line perpendicular to the B plane overlay line projected onto the A plane and passing through the point "a" in the A plane. In other words, a line drawn from the overlay point "a" in the A plane normal to the overlay line in the B plane strikes the overlay line at point M. The angle theta is the angle defined at the intersection of the line Ma and a line parallel to the Z-axis. These two angles are sufficient for determining the new orthogonal axes in accordance with Eulerian methods. The third angle is not needed because in the method used the gradient vectors are isolated rather than in the frame of reference and the Eulerian third shift is not made. However, if the third shift were made, it would also be found from the angle of the plane to the Y axis. Each new axis is a function of the original axis as determined by the following Eulerian equations:

X'=AX,

Y'=AY, and

Z'=AZ, where A is a product of successive matrices; i.e. A=BCD. (For an explanation of the Eulerian relationships see the book entitled "Classical Mechanics" by Herbert Goldstein at pages 107 et seq., published by Addison-Wesley Publishing Company, in 1950.)

The general rotation of the gradient vectors is given by the matrix A which is:

$$\left[A = B\cdot(C\cdot D) = \begin{pmatrix} \cos\theta\cos\phi - \sin\theta\sin\phi\sin\psi, & \sin\theta\cos\phi, & \cos\theta\sin\psi + \sin\theta\sin\phi\sin\psi \\ -\sin\theta\cos\phi - \cos\theta\sin\phi\sin\psi, & \cos\theta\cos\phi, & -\sin\theta\sin\psi + \cos\theta\sin\phi\cos\psi \\ -\cos\phi\sin\phi, & -\sin\phi, & \cos\phi + \cos\psi \end{pmatrix}\right]$$

$$A = B\cdot(C\cdot D) = \begin{pmatrix} \cos\theta\cos\psi - \sin\theta\sin\phi\sin\psi & \sin\theta\cos\phi & \cos\theta\sin\psi + \sin\theta\sin\phi\cos\psi \\ -\sin\theta\cos\psi - \cos\theta\sin\phi\sin\psi & \cos\theta\cos\phi & -\sin\theta\sin\psi + \cos\theta\sin\phi\cos\psi \\ -\sin\psi\cos\phi & -\sin\phi & \cos\phi\cos\psi \end{pmatrix}$$

This matrix is obtained from the three matrices which represent the rotation around the three major axes X,Y,Z.

The matrix B of the rotation about the Z axis by an angle θ is given by:

$$B = \begin{pmatrix} \cos\theta & \sin\theta & 0 \\ -\sin\theta & \cos\theta & 0 \\ 0 & 0 & 1 \end{pmatrix}$$

The matrix C of the rotation about the [Y] *X* axis by the angle ϕ is:

$$C = \begin{pmatrix} 1 & 0 & 0 \\ 0 & \cos\phi & \sin\phi \\ 0 & -\sin\phi & \cos\phi \end{pmatrix}$$

The matrix D of the rotation about the [X] *Y* axis by an angle ψ is:

$$D = \begin{pmatrix} \cos\psi & 0 & \sin\psi \\ 0 & 1 & 0 \\ -\sin\psi & 0 & \cos\psi \end{pmatrix}$$

For example, the rotation around the Z axis of the vector (X,Y,Z) by an angle θ, is obtained by the following operation:

$$\begin{pmatrix} X' \\ Y' \\ Z' \end{pmatrix} = \begin{pmatrix} \cos\theta & \sin\theta & 0 \\ -\sin\theta & \cos\theta & 0 \\ 0 & 0 & 1 \end{pmatrix}\begin{pmatrix} X \\ Y \\ Z \end{pmatrix}$$

which results in the following identity:

$$(X',Y'Z')=(X\ \mathrm{COS}\ \theta+Y\ \mathrm{SIN}\ \theta,-X\ \mathrm{SIN}\ \theta+Y\ \mathrm{COS}\ \theta,Z)$$

Figure 8:
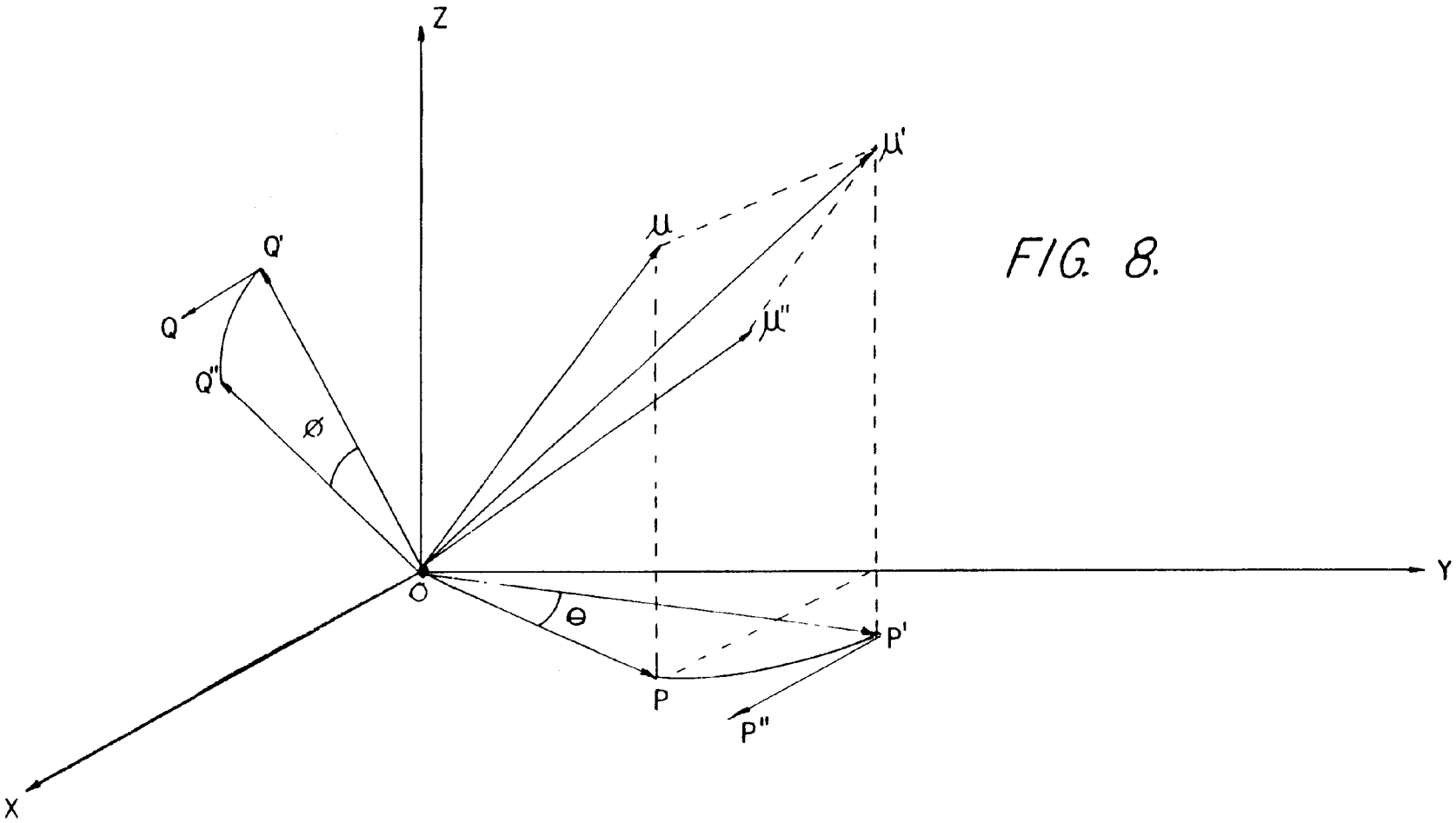
FIG. 8 graphically depicts the rotation of the axes to image at an oblique angle.

In FIG. 8 is shown the rotation of the vector $\mu$ by an angle θ around the Z axis to $\mu'$ (i.e. rotation of the projection P of $\mu$ on the X-Y plane by an angle θ to p'), rotation of $\mu'$ around the Y axis by an angle ϕ to u", (i.e. rotation of the projection Q' of u', after its initial rotation by θ around the Z axis, on the X-Z plane by an angle ϕ to Q"). In this example ψ=0.

Note that this system rotates the gradient vectors around the cartesian axes as distinct from Eulerian rotation in the above referenced book where the frame of reference is rotated.

The rotated new axes are shown in FIG. 8. The new axes are computed by the Eulerian computation unit 36 as set forth herein in the description of FIGS. 4 and 5 which depict details of unit 36.

Figure 4:
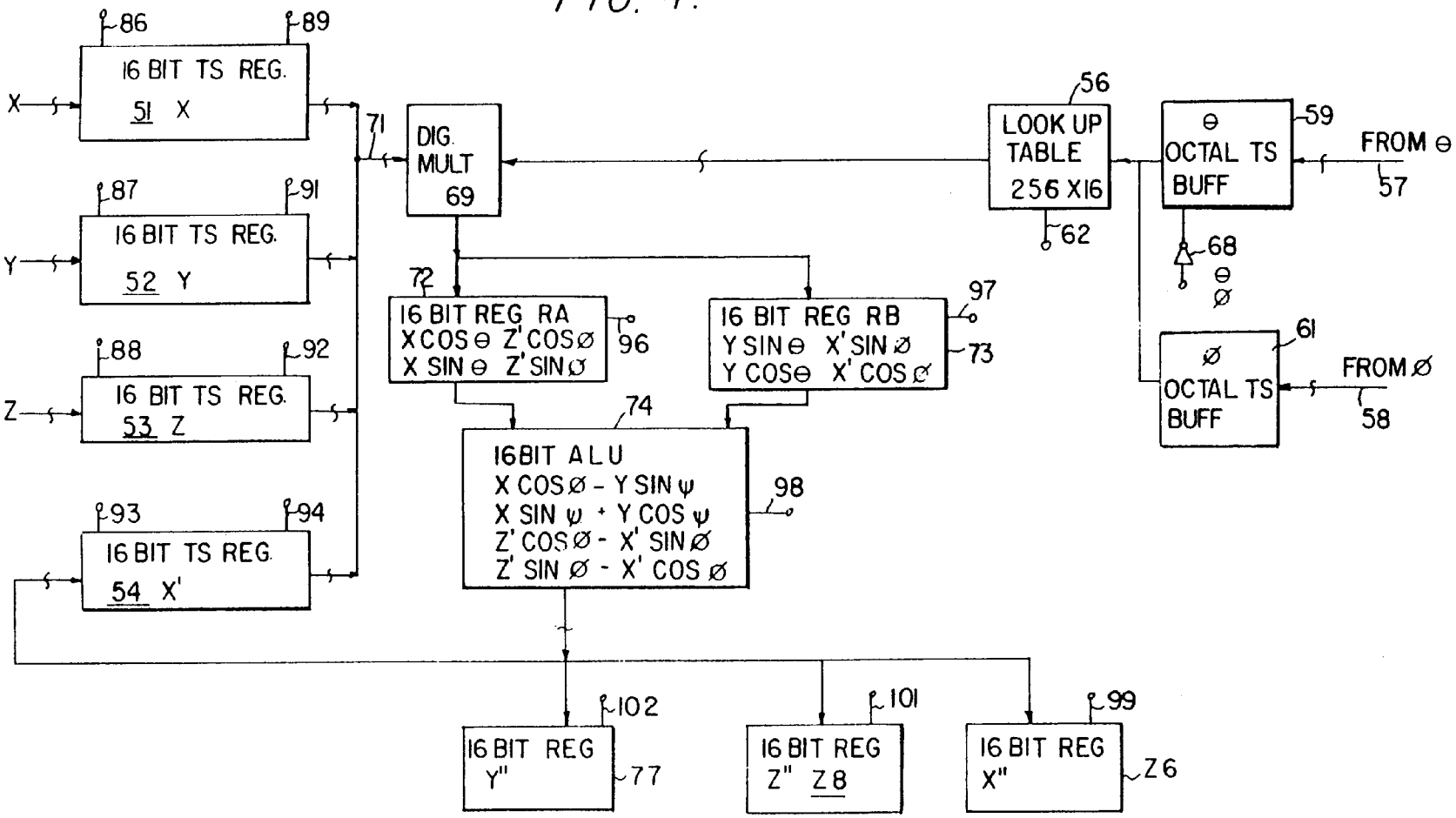
FIG. 4 is a block diagram showing of an embodiment of circuitry used for "rotating" the coordinate axes of an MRI system.

The function of the eqipment of the block diagram of FIG. 4 is to perform the operations necessary for rotating the coordinates automatically or, on a selective basis, semi-automatically. Registers 51, 52 and 53 (shown in FIG. 4) are provided for registering values obtained along the usual X, Y and Z coordinates. In a preferred embodiment each register is a 16 bit, three state unit, comprised of two 74 LS 373's for example. Fifteen bits are used for inputing the X, Y and Z information.

Means are provided for giving cos and sin functions of the theta and phi angles. More particularly a look-up table 56 provides these functions of the theta and phi angles. The theta and phi angles are inputted manually or automatically on conductors 57 and 58 which lead into alpha buffer unit 59 and gamma buffer unit 61 respectively. The look-up table 56 is operated responsive to enable signals or conductor 62 to receive the theta or phi information on conductor 64. Conductor 64 carries either theta information directly from buffer 59 or phi information from buffer 61 and conductor 66. Whether theta or phi information is received is determined by the signals delivered on conductor 67. If a logic "1" signal is delivered, the phi buffer is operative and if a logic "0" signal is delivered, the theta buffer is operative. An inverter 68 provides the enabling signal to the theta buffer 59 responsive to the logic "0" signal.

Means are provided for projecting the X, Y, Z or X' values onto other planes i.e. multiplying the X, Y, Z or X' values by the cos and sin values. More particularly a digital multiplier 69 is provided coupled to the X, Y, AND X' registers 51–54 and to the table look-up unit 56 over conductors 71 and 72 respectively. The output of the digital multiplier 69 is stored either in an RA register 72 or an RB register 73 depending on whether a latch 1 signal or the latch 2 signal is operative to enable registers R and RP respectively.

Means are also provided for computing the X", Y" and Z" values from the X, Y, AND Z projections. More particularly arithmetic and logic unit (ALU) 74 is provided coupled to the outputs of registers 72 and 73. The output of unit 74 is stored either in X' register 54 or in the X", Y" and Z" registers 76 77 and 78 respectively. The new values of the X" Y" or Z" axes appear on conductors 79, 81 and 82 respectively and are transmitted from unit 36 to processor 32.

Registers 51, 52 and 53 are activated for receiving X, Y, and Z data by individual strobe signals. For example, a strobe X signal is applied to register 51 on conductor 86. A strobe Y signal is applied to register 52 on conductor 87, and a strobe Z signal is applied to register 53 on conductor 92. In a similar manner data is read into register 54 responsive to a latch 3 signal on conductor 93 and data is read out from register 54 responsive to X' select signals on conductor 94. Note that the signals to registers 52, 53 and 54 for read-out purposes are logic 0 signals.

Registers RA and RB transmit information responsive to latch 1 and latch 2 signals on conductors 96 and 97 respectively. The ALU 74 dispatches its information responsive to an add select signal on conductor 98. Registers 76, 77 and 78 output X", Y" and Z" values responsive to latch 6, 4 and 5 signals on conductors 99, 102, and 101 respectively.

Figure 5:
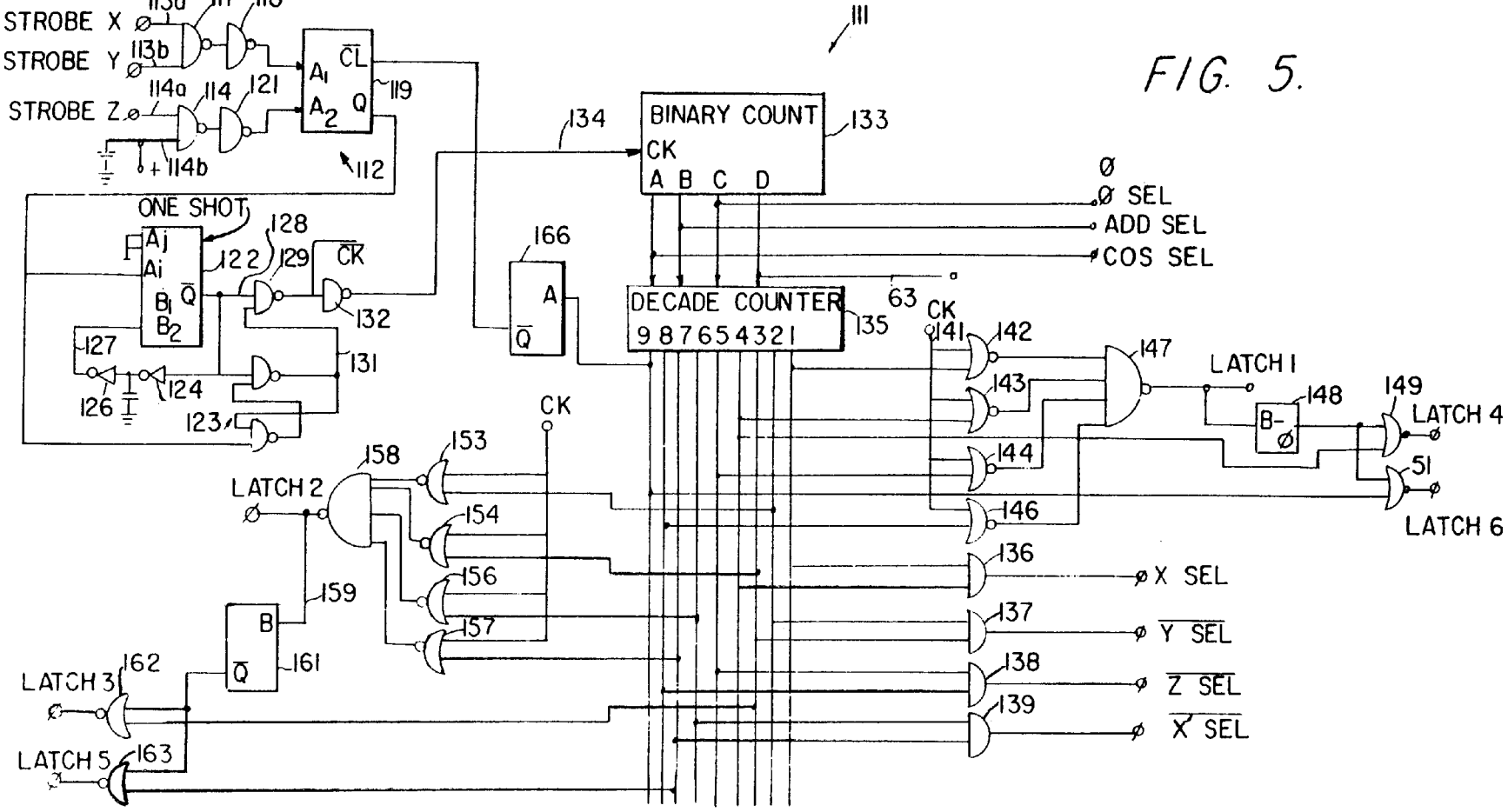
FIG. 5 is a block diagram of an embodiment of control circuitry used in conjunction with the circuitry of FIG. 4.

The control circuits for providing the control signals discussed with reference with FIG. 4 is shown in FIG. 5 at 111. The control circuit 111 comprises a clock circuit 112. One particular embodiment of a clock circuit is shown, however, many other types of clock circuits could be used within the scope of this invention. In the clock circuit 112, a pair of inverter units 113 and 114 are represented. The inverter units are operated responsive to the receipt of strobe X, strobe Y and strobe Z signals on conductors 113a, 113b and 114a respectively. Input 114b of inverter unit 114 is shown as attached permanently to a high. The output of inverter unit 114 goes through inverter unit 118 and into one input of one shot bistable unit 119. The other input to the bistable unit comes from unit 114 through inverter unit 121. Thus if there is an strobe X, Y or Z signal, then a signal is applied at A1 and A2 which initiates the operation of the clock.

The output of the one shot unit 119 appears on a conductor 116 and is directed to another one shot unit 122 and to one input of flip-flop unit 123. The $\overline{Q}$ (Q NOT) output of the one shot unit 122 is directed to the other input of the flip-flop unit 123 and is fed back into an input of the one host unit 122 through a pair of invertors 124, 126 and conductor 127. The Q output which appears on the conductor 128 is fed into an invertor a gate 129 that also receives an input from flip-flop unit 123 over conductor 131.

The output of inverter gate 129 is fed to inverter gate 132. The output of inverter gate 132 is the clock signal. A clock NOT (CL) signal is taken from the output of circuit 129 for use as required.

Figure 6:
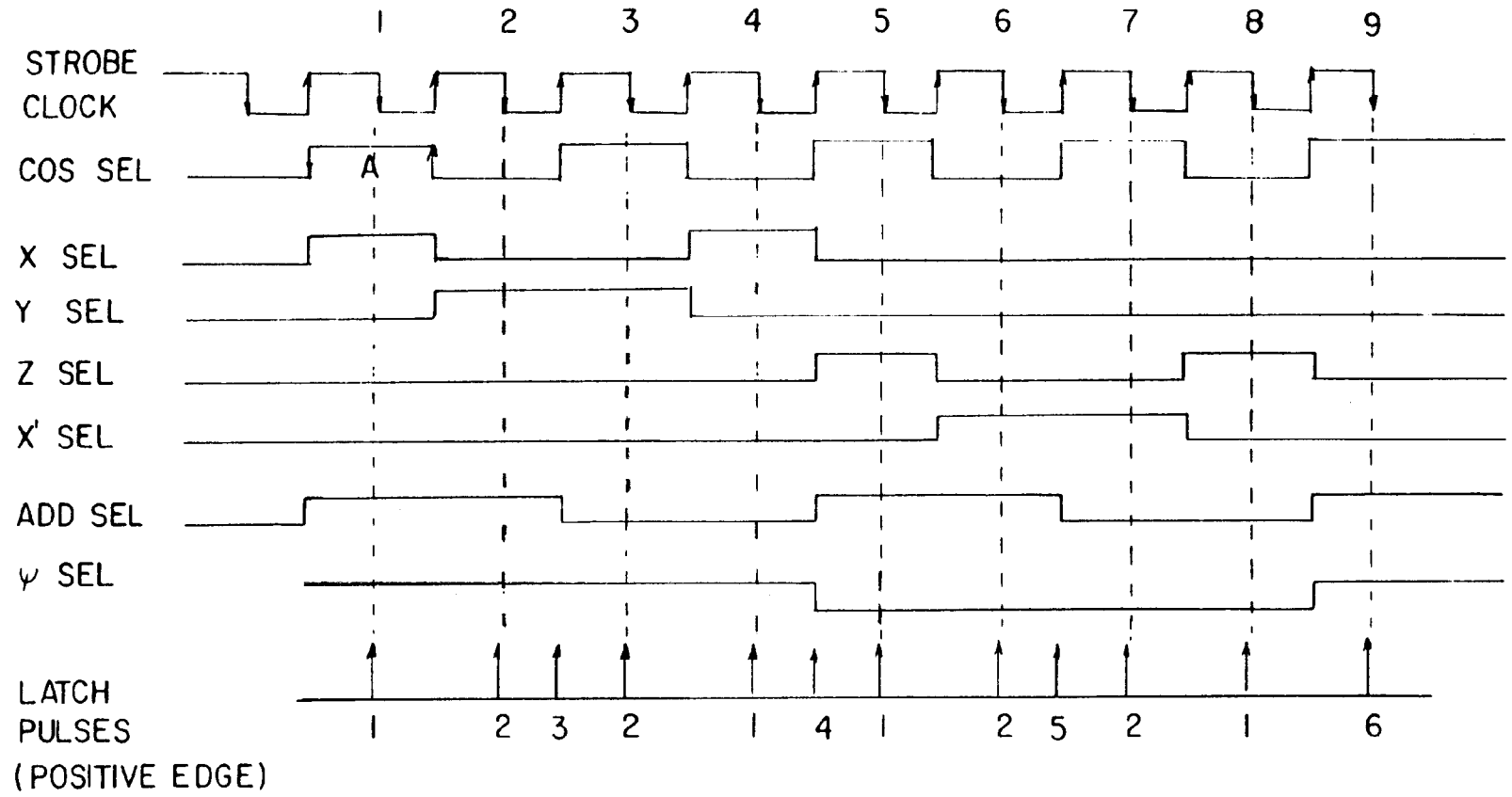
FIG. 6 is a timing diagram for use with FIGS. 4 and 5.

The clock signal shown in the timing diagram of FIG. 6 is fed into binary counter 133 over conductor 134. The counter 33 counts the edges of the clock pulses to provide four output signals A, B, C, and D. Thus, responsive to the first negative going edge of the clock signal and each subsequent negative going edge a cos select signal of a different sign is provided at output A of the binary counter 133 and connected to conductor 62. A second signal received from the binary counter 133 is the ADD select signal at output B connected to conductor 98. The signal changes sign at every second negative going edge.

All of the outputs of counter 133 are also fed into the one-of ten decoder unit 135. The output of the decoder unit is a high on one of its ten output conductors per output of the binary counter. These signals in conjunction with the clock signals are used to provide latch 1, 2, 3, 4, 5 and 6 control signals as well as X, Y, and X' select signals. The particular outputs of the decoder circuit 135 are low only responsive to lows at certain of the outputs of the counter and are high at other counter outputs. For example, a plurality of AND gates 136, 137, 138 and 139 determine the X SEL, Y SEL, Z SEL and X' SEL signals responsive to particular outputs of the decoder circuit 135 going low.

The latch 1 signal is obtained responsive to clock signal on conductor 141 and signals from the output of decoder 135. The decoder signals are transferred to four OR gates 142, 143, 144 and 146. The outputs of these four OR gates are conducted to the inputs of NAND gate 147. The output of the NAND gate 147 is the latch 1 signal.

The latch 1 signal is thus obtained for each positive going clock signal, i.e. when a low is obtained on outputs 1, 4, 5 and 8 of unit 135. The latch 1 signal is also inputed to one shot unit 148. The output of unit 148 is a delayed low directed to OR gates 149 and 151. The other input to gate 149 is the 5th output of the one-out-of-ten decoder unit 135. The other input to OR gate 151 is the 9th output of decoder 135.

The outputs of OR gates 149 and 151 are the latch 4 and latch 6 signals respectively. These latch signals occur responsive to the 5 and 9 low outputs of decoder unit 135, respectively, occuring while the delayed latch 1 signal is high.

The latch 2 signal is obtained responsive to the clock signal on conductor 152 which leads into OR gates 153, 154, 156 and 157. The other inputs to gates 153, 154, 156 and 157 are the second output, the third output, the sixth output and the seventh output of decoder 135 respectively. The outputs of gates 153, 154, 156 and 157 are conducted to NAND gate 158. The latch 2 signal at the output of gate 158 is conducted through conductor 159 to one-shot delay circuit 161. The output of the delay circuit 161 goes through OR gates 162 and 163. The other inputs to those gates are the third and the sixth output of circuit 135 respectively. The outputs of gates of 162 and 163 are the latch 3 and 5 signals respectively.

The generation of the control signals is shown more clearly on the timing diagram of FIG. 6. Responsive to the first clock pulse the binary counter 133 provides outputs on A. The output on a goes low for every other clock pulse. The output on B goes low for the 3rd and 4th pulses than high for the 5th and 6th pulses, etc. The output on C is high until the fifth pulse, then low until the ninth pulse. The "A" signal is used as the cos/sin sel i.e. cos sel when high and sin sel when low.

The "B" signals is used as the ADD sel control signal. The "C" signal is used as the $\phi$ sel signal.

The X sel control signal is generated responsive to there not being a high at both the 1 and 4 output of decoder 135.

These high outputs generate the X sel signal of the timing diagram. During the time period when either 1 or 4 is low an X sel signal is provided as indicated. In a similar manner the Y sel and Z sel and the X' sel signals are provided at the output of gates 137, 138 and 139 respectively.

In clock state 1 the following occurs:

The value of the input of the look-up table 56 is selected responsive to the θ sel signal.

The cos θ value at the output of the look-up table is selected responsive to the cos sel signal. The output is a 16 bit word which provides an output to the digital multiplier.

The X value from the three state input register 51 responsive to the X sel signal is provided to multiplier 69.

In the middle of clock state 1 the positive edge of the latch 1 pulse is generated.

Thus the X cos θ value is stored in RA register 76.

In the clock state 2, the following occurs:

the sin θ value at the output of the look-up table 56 is selected responsive to the sin θ sel signal.

the Y value from the three state input register 52 is selected responsive to the Y sel signal.

In the middle of this state a positive edge of the LATCH 2 pulse is generated and the value Y sin 0 is stored in register RB.

In the clock state 3 the following occurs:

the value at the input of the look-up table 56 is selected responsive to the continuing θ sel signal.

the cos θ value of the output of the look-up table is selected responsive to the high cos/sin sel signal.

the Y value is obtained from the three state input registers responsive to the continuing high Y sel signal.

Also in this state the positive edge of the LATCH 3 pulse is generated which causes the X cos θ−Y sin θ value to be stored in the X' three state register 54.

In the middle of this state the positive edge of the LATCH 2 pulse is generated which stores the value Y cos θ in the RB register.

In the clock state 4 the following occurs:

the φ value at the input of the look-up table 56 is selected responsive to the continuing φ sel signal.

the sin φ value at the output of the look-up table 56 is selected responsive to sin sel signal (cos sel NOT).

the X value from the three state input registers 51 is selected responsive to the X sel signal.

In the middle of this state the positive edge of the LATCH 1 pulse is provided to cause the value X sin φ to be stored in RA register 72.

In clock state 5 the following occurs:

the φ value at the input of the look-up table 56 is selected responsive to the φ sel signal.

the cos φ value of the output of the look-up table is selected responsive to the cos sel signal.

the Z value from the three state input register 53 is selected responsive to the Z sel signal.

In this state the positive edge of the LATCH 4 pulse is generated which causes the X sin θ+Y cos θ value to be stored in the output "Y" register. In the middle of this state the positive edge of the LATCH 1 pulse is again generated which stores the Z cos φ in the R/A register 73.

In the clock state 7 the following occurs:

the φ value at the input of the look-up table 56 is selected responsive to the φ sel signal.

the cos φ value at the output of the look-up table 56 is selected responsive to the cos sel signal.

the X' value from the three state input register 54 is selected responsive to the X' sel signal.

In this state the positive edge of the LATCH 5 pulse is generated which causes the Z' cos ψ−X sin ψ value to be stored in the Z' output register 78. In the middle of this state the positive edge of the LATCH 2 pulse is generated which causes the X' cos ψ value to be in the RB register 73.

In the clock state 8 the following occurs:

the ψ value at the input of the look-up table 56 is selected responsive to the ψ sel signal.

the sin ψ value at the output of the look-up table 56 is selected responsive to the cos sel signal.

the Z' value from the three state input register 53 is selected responsive to the Z sel signal.

Also in the middle of this state the positive edge of the LATCH 1 pulse is again generated which stores the Z' sin ψ in the RA register 72.

In the clock state 9—the decade sequencer 112 is blocked until a new strobe pulse arrives. More particularly the high on the 9 output of decoder 135 initiates a high signal from one shot circuit 166 to reset one shot circuit 119.

In this state the positive edge of the LATCH 6 pulse is generated which causes the Z' sin ψ+X' cos ψ value to be stored in the X" output register 76.

The use of the axes X' and Y' enables the imaging to be carried out in the same manner, except that the gradients used are automatically set by Eulerian computation unit. For example, instead of a gradient Z, a gradient Z' signal is automatically applied during the application of the Rf pulse. That is, GZ'=GZA. Simiaraly, gradient Y' encoding signal and a gradient X' sampling signal would be automatically applied during the application of the Rf signals in the above explained spin echo system.

It should be noted that a spin echo system or any other system of MR Imaging can be used for obtaining the data desired within the scope of this invention. The key thing is that the selection of the plane determines the new required axes which automatically then enable the proper gradient signals to be applied for the automatic selection of the desired and newly created plane.

Figure 7A:
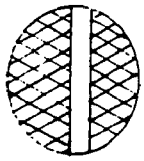
FIG. 7 is a pictorial and planar showing of one method of automatically determining angles involved in the inventive system.
Figure 7:
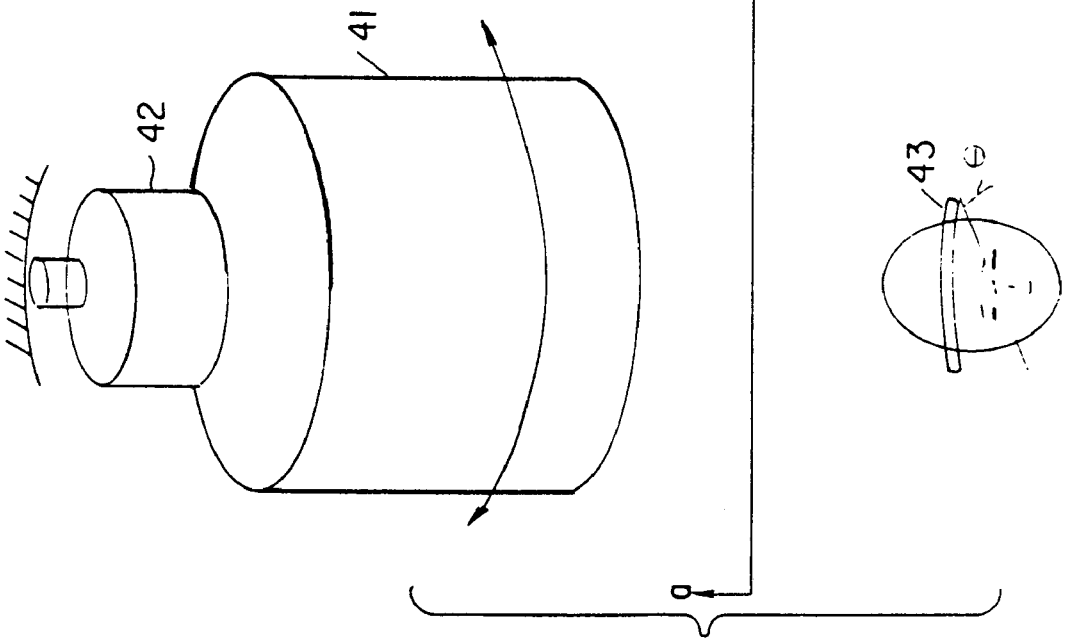

The system illustrated in FIG. 7 for obtaining the new plane uses a slit of light aligned with the patient's eyes for determining the angular displacement of the X axes. A light fixture 41 is shown coupled to means such as servo motor 42 for rotating the light fixture. As shown in FIG. 7A, the fixture is designed to project a slit of light. The servo motor turns responsive to the rotation of a setting control (not shown) by the clinician. The clinician turns the knob which remotely turns the servo motor and the light fixtures until the slit of light is aligned with the patient's eyes. The servo control indicates the angular rotation necessary for alignment. It is assumed herein that the patient's head is affixed in harness 43 and the angular displacement is thus now 0: the new coordinates are computed using the angles θ=0, φ=0, and ψ=0.

$$\begin{pmatrix} GX' \\ GY' \\ GZ' \end{pmatrix} A = \begin{pmatrix} COS\theta & SIN\theta & 0 \\ -SIN\theta & COS\theta & 0 \\ 0 & 0 & 1 \end{pmatrix} \begin{pmatrix} GX \\ GY \\ GZ \end{pmatrix}$$

and GX', GY' and GZ'=GX cos θ+Gy sin θ, −GX sin θ+GY cos θ and GZ.

The arrangement of FIG. 7 is only one of the many ways of visual alignment visual alignment means can be used for example in the magnet bore with a television camera for maintaining the alignment without a harness. Also, another servo control can be used for aligning the Y' axis.

While the invention has been described using particularly exemplary aspects of the invention it should be understood that this description is made by way of example only and not as a limitation on the scope of the invention.

What is claimed is:

1. A method of imaging a subject using MRI systems wherein the selected imaging plane is at any desired angle to the usual X, Y and Z coordinate axes of said MRI system, the method comprises the steps of:

(a) subjecting the subject to a strong static magnetic field along the Z axis in order to align magnetic spins in the Z direction in said subject being imaged;

(b) applying magnetic gradient vector pulses to vary said static field;

(c) generating FID signals by applying RF magnetic pulses rotating at Larmor frequencies to nutate said spins;

(d) selecting desired non-orthogonal imaging planes by selectively rotating the direction of the magnetic gradient vectors by determined angular amounts about coordinate axes prior to applying the magnetic gradient vector pulses;

(e) determining the angular amount to rotate the magnetic gradient vectors about the coordinate axis using visual indicators; and (f) projecting said visual indicators onto the image of said subject being imaged.

2. A method of imaging a subject using MRI systems wherein the selected imaging plane is at any desired angle to the usual X, Y and Z coordinate axes of said MRI system, the method comprising the steps of:

(a) subjecting the subject to a strong static magnetic field along the Z axis in order to align the magnetic spins in the Z direction in said subject being imaged;

(b) applying magnetic gradient vector pulses to vary said static field;

(c) generating FID signals by applying RF magnetic pulses rotating at Larmor frequencies to nutate said spins;

(d) selecting desired non-orthogonal planes by selectively rotating the direction of the magnetic gradient vectors by determined angular amounts about the coordinate axes prior to applying the magnetic gradient vector pulses;

(e) imaging in a first plane using the usual coordinate axes;

(f) imaging in a second plane using the usual coordinate axes;

(g) placing a visible line on the first plane in an area of interest;

(h) placing at least a visible dot in the second plane in an area of interest; and (i) using said line and said dot to define a new plane, said new plane being the selected non-orthogonal imaging plane, wherein said newly defined plane indicates the angular amounts to rotate the direction of the magnetic gradient vector pulses.

3. A method of imaging a subject using MRI systems wherein the selected imaging plane is at any desired angle to the usual X, Y and Z coordinate axes of said MRI system, the method comprises the steps of:

(a) subjecting the subject to a strong static magnetic field along the Z axis in order to align magnetic spins in the Z direction in the said subject being imaged;

(b) applying magnetic gradient vector pulses to vary said static field;

(c) generating FID signals by applying RF magnetic pulses rotating at a Larmor frequency to nutate said spins;

(d) selecting desired non-orthogonal imaging planes by selectively rotating the direction of the magnetic gradient vectors by determined angular amounts about the coordinate axes prior to applying the magnetic gradient vector pulses;

(e) rotating the Z gradient direction through θ degrees to Z', the X gradient direction through [θ] φ degrees to X', the Y gradient direction through ψ degrees to Y', where θ, φ and ψ are determined angular amounts; and (f) said last named step including multiplying the X, Y and Z gradients by a matrix A defined as follows:

$$\left[A=\begin{pmatrix} \cos\theta\cos\psi-\sin\theta\sin\phi\sin\psi & \sin\theta\cos\phi & \cos\theta\sin\psi+\sin\theta\sin\phi\cos\psi \\ -\sin\theta\cos\psi-\cos\theta\sin\phi\sin\psi & \cos\theta\cos\phi & -\sin\theta\sin\psi+\cos\theta\sin\phi\cos\psi \\ -\sin\psi\cos\phi & -\sin\phi & \cos\phi\cos\psi \end{pmatrix}\right]$$

$$A=\begin{pmatrix} \cos\theta\cos\psi-\sin\theta\sin\phi\sin\psi & \sin\theta\cos\phi & \cos\theta\sin\psi+\sin\theta\sin\phi\cos\psi \\ -\sin\theta\cos\psi-\cos\theta\sin\phi\sin\psi & \cos\theta\cos\phi & -\sin\theta\sin\psi+\cos\theta\sin\phi\cos\psi \\ -\sin\psi\cos\phi & -\sin\phi & \cos\phi\cos\psi \end{pmatrix}.$$

4. A method of imaging a subject using MRI systems wherein the selected imaging plane is at any desired angle to the usual X, Y and Z coordinate axes of said MRI system, the method comprises the steps of:

(a) subjecting the subject to a strong static magnetic field along the Z axis in order to align magnetic spins in the Z direction in the said subject being imaged;

(b) applying magnetic gradient vector pulses to vary said static field;

(c) generating FID signals by applying RF magnetic pulses rotating at Larmor frequencies to nutate said spins;

(d) selecting desired non-orthogonal imaging planes by selectively rotating the direction of the magnetic gradient vectors by determined angular amounts about the coordinate axes prior to applying the magnetic gradient vector pulses; and (e) rotating the Z, X and Y gradient direction θ degrees to Z, X, and Y respectively, wherein θ is a determined angular amount for the Z gradient, said method of rotating including multiplying the X, Y and Z gradients by a matrix B, said matrix B is defined as:

$$B=\begin{pmatrix} \cos\theta & \sin\theta & 0 \\ -\sin\theta & \cos\theta & 0 \\ 0 & 0 & 1 \end{pmatrix}.$$

5. A method of imaging a subject using MRI systems wherein the selected imaging plane is at any desired angle to the usual X, Y and Z coordinate axes of said MRI system, the method comprises the steps of:

(a) subjecting the subject to a strong static magnetic field along the Z axis in order to align magnetic spins in the Z direction in said subject being imaged;

(b) applying magnetic gradient vector pulses to vary said static field;

(c) generating free induction delay (FID) signals by applying RF magnetic pulses rotating at Larmor frequencies to nutate said spins;

(d) selecting desired non-orthogonal imaging planes by selectively rotating the direction of the magnetic gradient vectors by determined angular amounts about the coordinate axes prior to applying the magnetic gradient vector signals; and (e) rotating the Z, X and Y gradients $\phi$ degrees to Z', X' and Y' where $\phi$ is a determined angular amount for the X gradient by multiplying the Z, X and Y gradients by a matrix C, where C is defined as:

$$C = \begin{pmatrix} 1 & 0 & 0 \\ 0 & \cos\phi & \sin\phi \\ 0 & -\sin\phi & \cos\phi \end{pmatrix}.$$

6. A method of imaging a subject using MRI systems wherein the selected imaging plane is at any desired angle to the usual X, Y and Z coordinate axes of said MRI system, the method comprises the steps of:

(a) subjecting the subject to a strong static magnetic field along the Z axis in order to align magnetic spins in the Z direction in said subject being imaged;

(b) applying magnetic gradient vector pulses to vary said static fields;

(c) generating FID signals by applying RF magnetic pulses rotating at Larmor frequencies to nutate said spins;

(d) selecting desired non-orthogonal imaging planes by selectively rotating the direction of the magnetic gradient vectors by determined angular amounts about the coordinate axes prior to applying the magnetic gradient vector pulses;

(e) rotating the Z, X and Y gradient direction by $\psi$ degrees to Z', X' and Y' respectively where $\psi$ is a determined angular amount for the Y gradient by multiplying the [Z] *X*, Y and Z gradients by a matrix D, where D is defined as:

$$\left[ D = \begin{pmatrix} \cos\phi & 0 & \sin\psi \\ 0 & 1 & 0 \\ -\sin\psi & 0 & \cos\psi \end{pmatrix} \right]$$

$$D = \begin{pmatrix} \cos\psi & 0 & \sin\psi \\ 0 & 1 & 0 \\ -\sin\psi & 0 & \cos\psi \end{pmatrix}.$$

7. A system of imaging subjects using MRI systems wherein the selected imaging plane is at any desired angle to the usual X, Y and Z coordinate axes of said MRI systems, said system comprising:

(a) means for subjecting the subject to a strong static magnetic field along the Z axis in order to align magnetic spins in the Z direction in said subject being imaged;

(b) means for applying magnetic gradient vector pulses to vary said static field;

(c) means for generating FID signals by applying RF magnetic pulses rotated at Larmor frequencies to nutate said spins;

(d) means for selecting desired non-orthogonal imaging planes by rotating the direction of the magnetic gradient vectors by determined amounts about the coordinate axes prior to applying the magnetic gradient vector pulses; and (e) means for determining the angular amount to rotate the magnetic gradient vectors about the coordinate axes including means for projecting visual indicators onto images of said subject being imaged.

8. A system of imaging a subject using MRI systems wherein the selected imaging plane is at any desired angle to the usual X, Y and Z coordinate axes of said MRI systems, said system comprising:

(a) means for subjecting the subject to a strong static magnetic field along the Z axis in order to align magnetic spins extending in the Z direction in said subject being imaged;

(b) means for applying magnetic gradient vector pulses to vary said static fields;

(c) means for generating free induction decay (FID) signals by applying RF magnetic pulses rotating at Larmor frequencies to nutate said spins;

(d) means for selecting desired non-orthogonal imaging planes by rotating the direction of the magnetic gradient vectors by determined angular amounts about the coordinate axis prior to applying gradient vector signals;

(e) means for rotating the Z gradient direction through $\theta$ degrees to Z', the X gradient direction through $\phi$ degrees to X', the Y gradient direction $\psi$ degrees to Y' where $\theta$, $\phi$ and $\psi$ are determined angular amounts;

(f) said last named means including means for multiplying the X, Y and Z gradients by a matrix A defined as follows:

$$\left[ A = \begin{pmatrix} \cos\theta\sin\phi - \sin\theta\sin\phi\sin\psi & \sin\theta\cos\phi & \cos\theta\sin\psi + \sin\theta\sin\phi\sin\psi \\ -\sin\theta\cos\phi - \cos\theta\sin\phi\sin\psi & \cos\theta\cos\phi & -\sin\theta\sin\psi + \cos\theta\sin\phi\cos\psi \\ -\cos\phi\sin\theta & \sin\phi & \cos\phi + \cos\phi \end{pmatrix} \right]$$

$$A = \begin{pmatrix} \cos\theta\cos\psi - \sin\theta\sin\phi\sin\psi & \sin\theta\cos\phi & \cos\theta\sin\psi + \sin\theta\sin\phi\cos\psi \\ -\sin\theta\cos\psi - \cos\theta\sin\phi\sin\psi & \cos\theta\cos\phi & -\sin\theta\sin\psi + \cos\theta\sin\phi\cos\psi \\ -\sin\psi\cos\phi & -\sin\phi & \cos\phi\cos\psi \end{pmatrix}.$$

9. The system of claim 7 including:

means for imaging in a first plane using the usual coordinate axes, means for imaging in a second plane using the usual coordinate system;

means for placing at least a line in the first plane in an area of interest, means for placing at least a dot in the second plane in an area of interest, and means for using said line and said dot to define a new plane, said new plane being the selected non-orthogonal imaging plane, whereby said newly defined plane indicates the angular amounts to rotate the direction of the gradient vector signals.

10. The system of claim 7 including means for rotating the Z, X and Y gradient directions θ degrees to Z', X' and Y', where θ is a determined angular amount for the Z gradient by multiplying the Z, X and Y gradients by the matrix B, where B is defined as:

$$B = \begin{pmatrix} \cos\theta & \sin\theta & 0 \\ -\sin\theta & \cos\theta & 0 \\ 0 & 0 & 1 \end{pmatrix}.$$

11. The system of claim 7 including means for rotating the Z, X and Y gradients ϕ degrees to Z', X' and Y' where ϕ is a determined angular amount for the X gradient, by multiplying the Z, X and Y gradients by the matrix C, where C is defined as:

$$C = \begin{pmatrix} 1 & 0 & 0 \\ 0 & \cos\phi & \sin\phi \\ 0 & -\sin\phi & \cos\phi \end{pmatrix}.$$

12. The system of claim 7 including means for rotating the Y gradient direction ψ degrees to Y', where ψ is a determined angular amount for the Y gradient by multiplying the X, Y and Z gradients by a matrix D, where D is defined as:

$$D = \begin{pmatrix} \cos\psi & 0 & \sin\psi \\ 0 & 1 & 0 \\ -\sin\psi & 0 & \cos\psi \end{pmatrix}.$$

* * * * *